United States Patent [19]
Hayashi et al.

[11] Patent Number: 5,661,325
[45] Date of Patent: Aug. 26, 1997

[54] SRAM STRUCTURE

[75] Inventors: Taketoshi Hayashi; Ryuzo Tagami, both of Tokyo, Japan

[73] Assignee: NKK Corporation, Japan

[21] Appl. No.: 508,986

[22] Filed: Jul. 28, 1995

[30] Foreign Application Priority Data

Jul. 29, 1994 [JP] Japan .................. 6-196252
Sep. 30, 1994 [JP] Japan .................. 6-259842

[51] Int. Cl.$^6$ .................. H01L 29/76; H01L 29/00; H01L 27/11
[52] U.S. Cl. .................. 257/393; 257/538; 257/904
[58] Field of Search .................. 257/393, 903, 257/904, 538

[56] References Cited

U.S. PATENT DOCUMENTS 5,241,206  8/1993  Lee et al. .................. 257/904

Primary Examiner—Wael Fahmy
Attorney, Agent, or Firm—Nixon & Vanderhye

[57] ABSTRACT

In a semiconductor device, an undoped polysilicon layer on the uppermost layer is used as a resistor having a high resistance without any patterning. A metal wiring layer formed on this resistor is connected to a conductive layer formed below the resistor via a contact hole extending through the high resistor device. In addition, by oxidizing an end portion, exposed in the contact hole, of the resistor, an oxide film is interposed between the high resistor device and the metal wiring layer to attain electrical insulation therebetween. In this manner, the resistor is formed of the undoped polysilicon layer by using a multilayered polysilicon structure including the undoped polysilicon layer. Therefore, the integration degree can be increased, and at the same time, a stepped portion accompanying the multilayered silicon structure is relaxed to improve the flatness of the surface and prevent poor step coverage or bridging of an upper wiring layer.

14 Claims, 10 Drawing Sheets

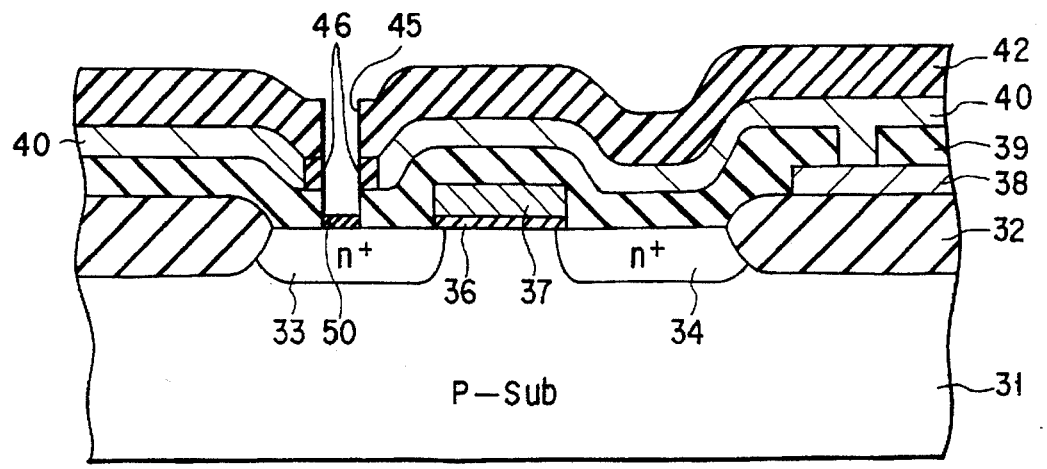
F I G. 4
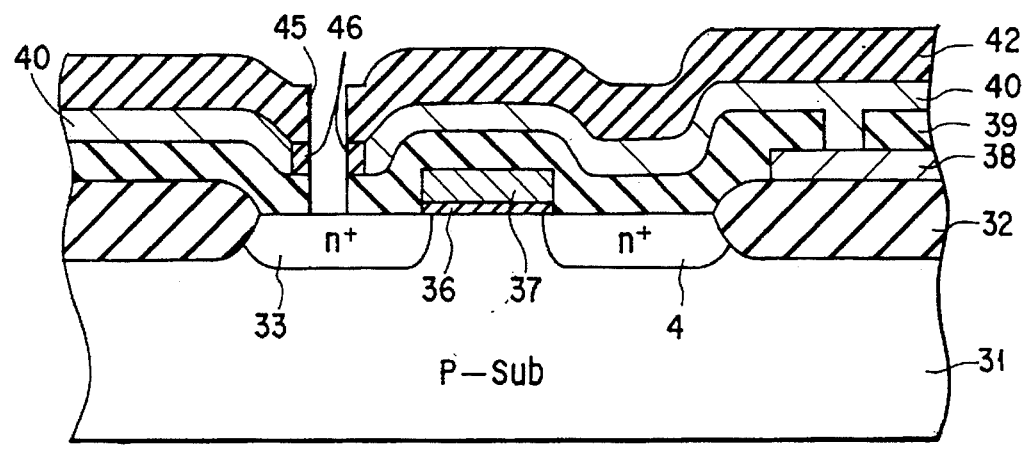
F I G. 5
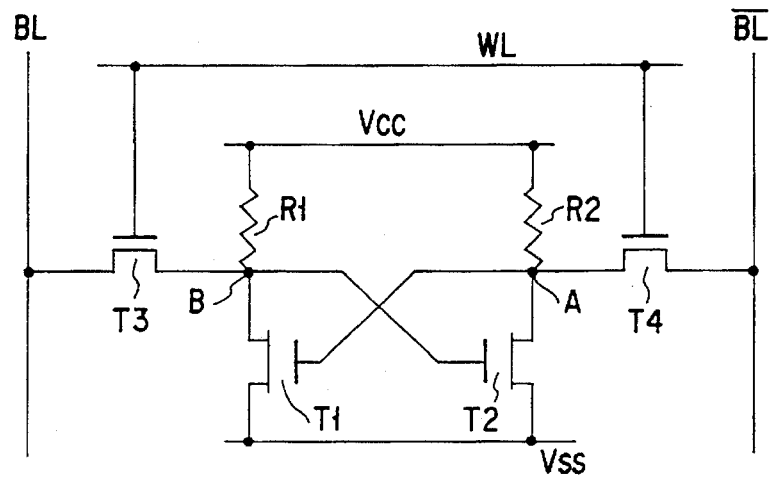
F I G. 6

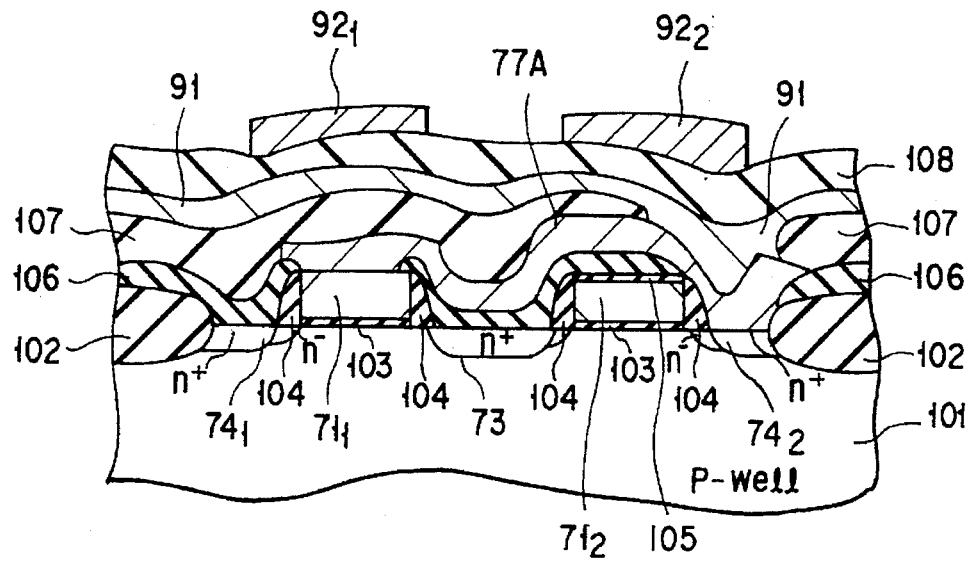
F I G. 9
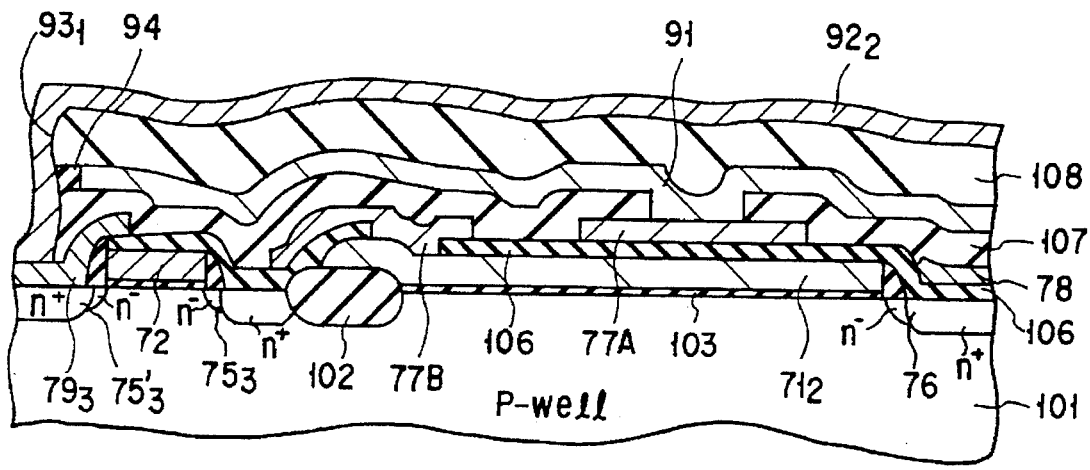
F I G. 10

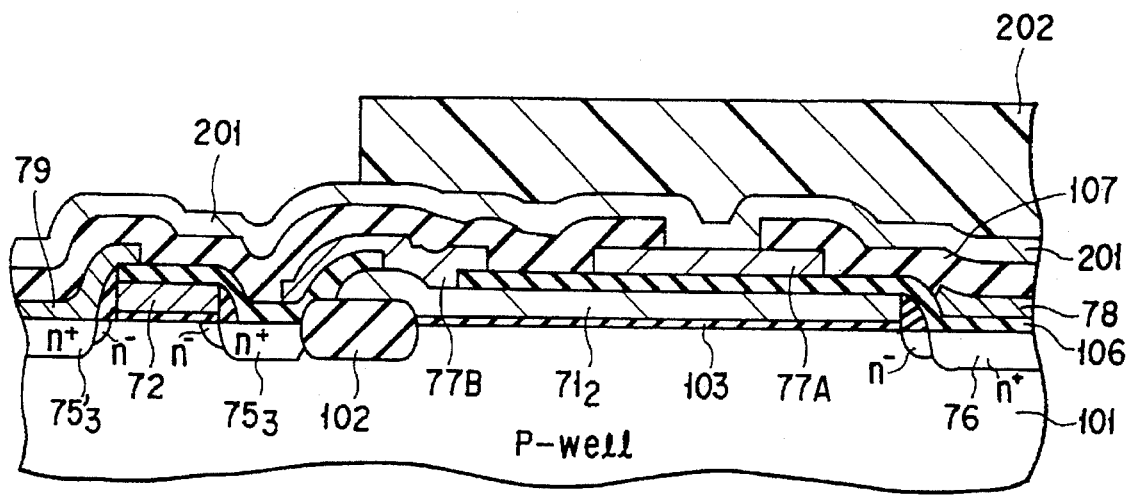
F I G. 20
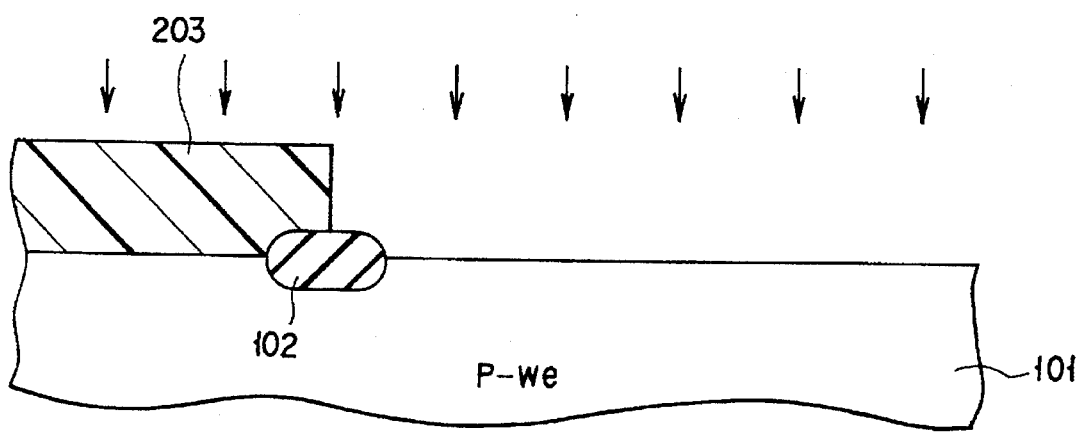
F I G. 21

SRAM STRUCTURE

BACKGROUND OF THE INVENTION

1. Field of the Invention

The present invention relates to a semiconductor device having a multilayered structure of silicon and, more particularly, to a semiconductor device using an undoped polysilicon layer as a load resistor device. The present invention also relates to a static random access memory (SRAM) having the above characteristic features as a practical application of the semiconductor device.

2. Description of the Related Art

Polysilicon layers are used in various semiconductor devices as electrodes, interconnections, wirings, and load resistors. Normally used is a low resistance polysilicon layer to which a predetermined conductivity is imparted by being doped with impurities. An undoped polysilicon layer is used, however, in a high resistor device, such as a load resistor of an SRAM, a device that requires a very high resistance of giga-ohms to tera-ohms.

A multilayered structure of silicon is employed in the method of forming, in a device, a wiring layer of a low resistance and a load resistor of a high resistance. In this case, an undoped polysilicon layer and a low resistor polysilicon layer are normally used as the uppermost layer and an underlayer, respectively. FIG. 1 shows an example of such a multilayered polysilicon structure.

Reference numeral 11 in FIG. 1 denotes a p-type silicon substrate. On the surface of the silicon substrate 11, a thick field oxide 12 is selectively formed. An $n^+$-type source region 13 and an $n^+$-type drain region 14, which are isolated from each other, are formed in an active region surrounded by the field oxide 12. Above the channel region thus formed, a gate electrode 16 of the first polysilicon layer doped with phosphorus is formed, being stacked on and above a gate oxide film 15. A polysilicon wiring layer 17 is formed over apart of the field oxide 12 which adjoins the drain region 14 by patterning the first polysilicon layer. On the gate electrode 16 and the polysilicon wiring layer 17, an insulating interlayer 18 of $CVD\text{-}SiO_2$ is formed to cover the entire surface of the silicon substrate 11 together with the gate electrode 16 and the polysilicon wiring layer 17. A resistor having a high resistance 19 is formed by linearly patterning the undoped second polysilicon layer. This resistor 19 is connected to the polysilicon wiring layer 17 via a contact hole. Above the resistor 19, aluminum (Al) wiring layers 21 and 22 are formed, being stacked on and above a $CVD\text{-}SiO_2$ insulating interlayer 20 deposited on the entire surface of the resistor 19. Of these wiring layers, the Al wiring layer 21 is connected to the source region 13 via a contact hole. The Al wiring layer 22 is connected to the resistor 19 via a contact hole. A barrier metal layer 23 consisting of titanium nitride is interposed between the Al wiring layer 22 and the high resistor device 19.

The integration degree can be increased because, as described above, the resistor 19 can be stacked on another device in the semiconductor integrated circuit having the multilayered polysilicon structure including the undoped polysilicon layer. Note that the above example uses a two-layered polysilicon structure, and that examples using multilayered polysilicon structures of three or more layers are also well known.

In the above multilayered polysilicon structure, however, a plurality of polysilicon layers are stacked via the insulating interlayers. Therefore, patterned polysilicon layers such as the polysilicon wiring layer 17 and the resistor 19 cross complicatedly. For this reason, a cross portion where the polysilicon patterns of different layers cross each other has a large stepped portion. As a result, poor step coverage of a metal wiring layer formed on the cross portion and a short circuit or bridging occur.

A special mask is needed to pattern the polysilicon layer and form the high resistor device 19, resulting in an increase in manufacturing cost.

SUMMARY OF THE INVENTION

The present invention has been made in consideration of the above situation, and has, as its first object, the advantage in that a resistor having a high resistance is formed of an undoped polysilicon layer by using a multilayered polysilicon structure including the undoped polysilicon layer, and that at the same time, the above problem of a stepped portion can be reduced.

It is the second object of the present invention to provide a semiconductor device which has a multilayered polysilicon structure including a high resistor device of an undoped polysilicon layer as described above, and can be manufactured without using any special photomask for patterning the resistor.

It is the third object of the present invention to provide an SRAM having the characteristic features of the above invention as a preferred embodiment in application.

According to the invention, there is provided a semiconductor device comprising: a semiconductor substrate having an impurity diffusion region formed on a major surface; a low resistance silicon-containing layer provided on the major surface of the semiconductor substrate via an insulating layer and formed with a desired pattern, the low resistance silicon-containing layer functioning as one of an electrode and an interconnection; a high resistance silicon layer formed on the major surface of the semiconductor substrate including the low resistance silicon-containing layer via an insulating layer, the high resistance silicon layer being not patterned, being connected to the low resistance silicon layer via a contact hole which is formed to extend through the insulating layer, and functioning as a resistor; and a metal wiring layer provided on a surface of the high resistance silicon layer via an insulating layer and formed with a desired pattern, the metal wiring layer being connected to one of the low resistance silicon-containing layer and the impurity region via a contact hole which is formed to extend through at least the insulating layer and the high resistance silicon layer.

Also, according to the invention, there is provided a semiconductor device comprising an SRAM memory cell formed in an active region wherein a core portion including two pull down MOS transistors, a cross coupling interconnection, a load resistor, and a $V_{cc}$ line, which constitute a flip-flop circuit of the SRAM memory cell, is formed in a predetermined core area of the active region; two pass MOS transistors of the SRAM memory cell are formed in the active region outside the core area; and the load resistor consists of another high resistance silicon layer which is different from a layer of gate electrodes of the MOS transistors, the cross coupling interconnection, and the $V_{cc}$ line, and is patterned to a planar shape to entirely covers the core area.

Also, according to the invention, there is provided a method for manufacturing a semiconductor device which has an SRAM memory cell formed in an active region, and in which a core portion including two pull down MOS transistors, a cross coupling interconnection, a load resistor, and a $V_{cc}$ line, which constitute a flip-flop circuit of the SRAM memory cell, is formed in a predetermined core area of the active region, two pass MOS transistors of the SRAM memory cell are formed in the active region outside the core area, and the load resistor consists of another high resistance silicon layer which is different from a layer of gate electrodes of the MOS transistors, the cross coupling interconnection, and the $V_{cc}$ line, and is patterned to a planar shape to entirely covers the core area, comprising the steps of: forming a resist pattern having an opening in the core area, and performing channel ion implantation in the core area using the resist pattern as a blocking mask in order to adjust threshold values of the pull down MOS transistors; and forming a resist pattern for covering the core area on the high resistance silicon layer, and patterning the high resistance silicon layer using the resist pattern as an etching mask to form the load resistor, wherein the resist pattern used for the etching mask is made by using a photomask, which is identical to the blocking mask, and a photoresist the type of which is the reverse to that used for forming the blocking mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3 to 5 are sectional views respectively showing steps in a method for manufacturing of the semiconductor device according to the first embodiment of the present invention;

FIG. 6 is an equivalent circuit diagram of an SRAM memory cell;

FIG. 9 is a sectional view taken along the lines IX—IX of FIGS. 7 and 8;

FIG. 10 is a sectional view taken along the lines X—X of FIGS. 7 and 8;

FIGS. 20 and 21 are sectional views showing each steps of manufacturing the SRAM memory cell according to the third embodiment of the present invention.

DETAILED DESCRIPTION OF THE PREFERRED EMBODIMENTS

One embodiment of a semiconductor device to which the present invention is applied will be described as the first embodiment with reference to FIG. 2.

Figure 2:
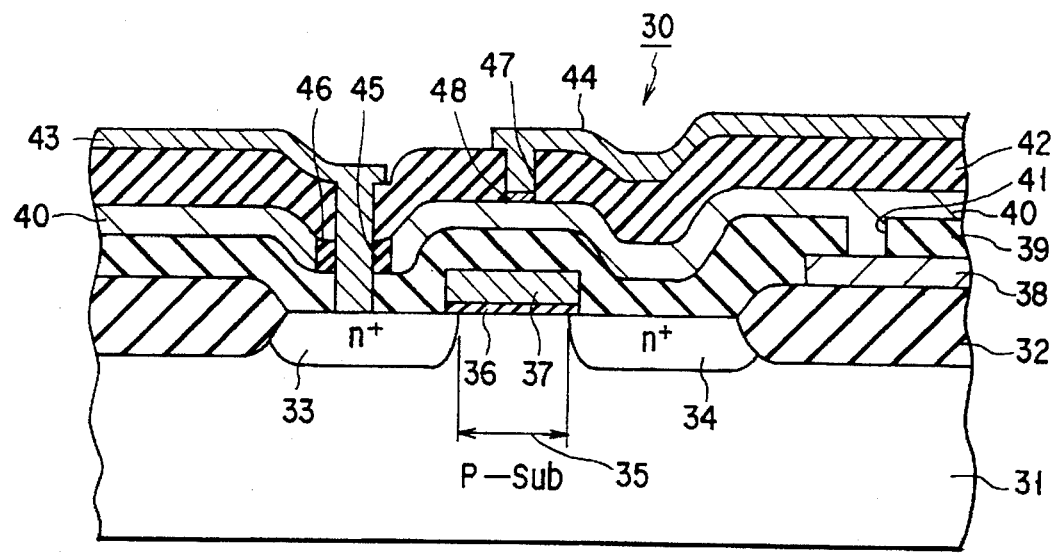
FIG. 2 is a sectional view showing a semiconductor device according to the first embodiment of the present invention.

Reference numeral 31 in FIG. 2 denotes a p-type silicon substrate. On the surface of the silicon substrate 31, a thick field oxide film 32 is selectively formed. An $n^+$-type source region 33 and an $n^+$-type drain region 34, which are isolated from each other, are formed in an element area surrounded by the field oxide 32. Above a channel region 35 between the source region 33 and the drain region 34, a gate electrode 37 consisting of the first polysilicon layer doped with phosphorus (P) is formed, being stacked on and above a gate oxide 36. A wiring layer 38 is formed above a part of the field oxide 31 which adjoins the drain region 34 and by patterning the first polysilicon layer. The wiring layer 38 contacts with gates of other transistors. On the gate electrode 37 and the wiring layer 38, an insulating interlayer 39 consisting of $CVD-SiO_2$, for example, is formed to cover the entire surface of the silicone substrate 31 including the gate electrode 37 and the wiring layer 38.

An undoped second polysilicon layer 40 is formed on the entire surface of this insulating interlayer 39. This second polysilicon layer 40 is, unlike the conventional one, not linearly patterned. That is, this second polysilicon layer 40 is not patterned at all and is used as a resistor having a high resistance without any change or any patterning. This resistor is connected to the wiring layer 38 via a contact hole 41.

On the second polysilicon layer 40 that comprises the resistor, first and second aluminum (Al) wiring layers 43 and 44 are formed via a $CVD-SiO_2$ insulating interlayer 42 deposition.

Of these wiring layers 43 and 44, the first Al wiring layer 43 is connected to the source region 33 via a contact hole 45. An insulating layer 46 is formed on the end face, exposed in the contact hole 45, of the undoped second polysilicon layer 40. The insulating layer 46 insulates the second polysilicon layer 40 from the first aluminum wiring layer 43.

On the other hand, the aluminum wiring layer 44 is connected to the resistor via a contact hole 47. A barrier metal layer 48 consisting of titanium nitride is, for example, interposed between the second Al wiring layer 44 and the resistor.

In this embodiment as described above, the gate electrode 36 and the wiring layer 38 consist of polysilicon which is decreased in resistance upon being doped with impurities. However, they are not limited to doped polysilicon layers. The gate electrode 36 and the wiring layer 38 can be any low resistance layer containing silicon. The low resistance layer, for example, can be made of amorphous silicon which is also doped with impurities, or metal silicides such as tungsten silicide.

Also, the material for high resistor devices are not limited to the undoped polysilicon. Undoped amorphous silicon can be utilized instead.

The first characteristic feature of the semiconductor device according to this embodiment described above is that the resistor of the undoped second polysilicon layer 40 is, unlike the conventional one, not linearly patterned. That is, in this embodiment, the second polysilicon layer 40 is used as the high resistor device without any change or any patterning.

This characteristics arrangement is based on the following finding.

It has been usually recognized that an undoped polysilicon layer must be linearly patterned like a normal resistor device to obtain a high resistance for a high resistor device required for a high resistance of giga-ohms to tera-ohms.

Figure 1:
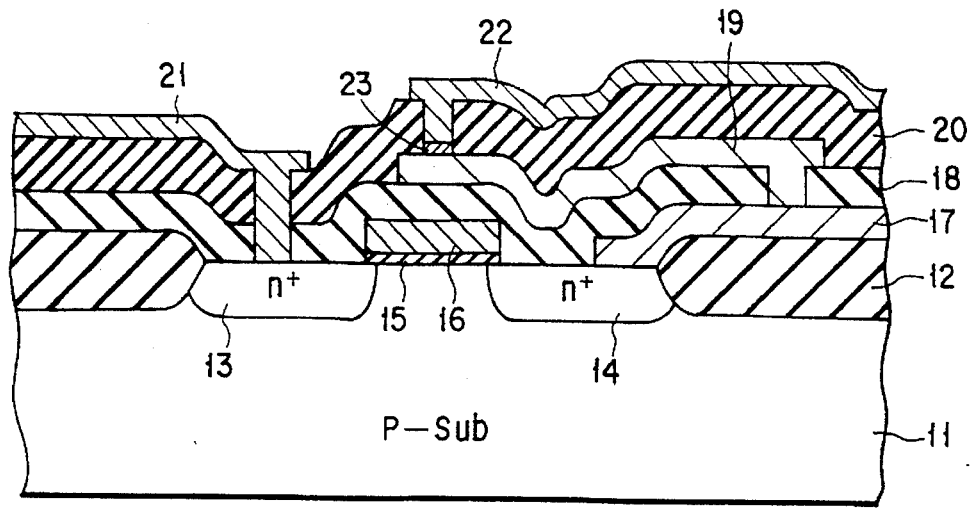
FIG. 1 is a sectional view showing a conventional semiconductor device.

However, it was proved that the undoped polysilicon pattern 19 itself did not much contribute when a resistance between the metal wiring layer 22 and the polysilicon wiring layer 17 in the conventional semiconductor device shown in FIG. 1 was divided into the following three components to measure a contribution ratio of the resistance components.

(a) Resistance component (to be referred to as R(a) hereinafter) of the undoped polysilicon pattern 19 itself (b) Resistance component (to be referred to as R(b) hereinafter) of a contact to the polysilicon wiring layer 17

(c) Resistance component (to be referred to as R(c) hereinafter) of a contact to the metal wiring layer 22

First, R(a)+R(b)+R(c) was measured using normal TEG (Test Element Group).

On the other hand, the high resistor device 19 consisting of an independent undoped polysilicon layer pattern was formed without providing any contact to another wiring layer to measure its resistance component R(a). When R(a)/R(a)+R(b)+R(c) was calculated on the basis of the obtained measurement result, it was found that R(a) was about less than 40% at most. This means that the two contact resistance components can satisfy almost the resistance required for the resistor 19.

The obtained result indicates that a sufficiently high resistance can be obtained as the load resistance even if an undoped polysilicon layer was, unlike the conventional one, not patterned to a normal linear load resistor. This is because the contact resistance component R(b) and R(c) between the two polysilicon layers is extremely high.

On the basis of the above result, the present invention uses the undoped second polysilicon layer 40 not subjected to any patterning as a high resistor device, as shown in FIG. 2. This relaxes a stepped portion and prevents poor step coverage of the aluminum wiring layers 43 and 44 formed on the second polysilicon layer 40, and a short circuit or bridging. Further, a patterning step and a special mask used in the step for a resistor can be eliminated.

In the above embodiment, since the undoped second polysilicon layer 40 used as the high resistor device is not patterned at all, the contact portion of the aluminum wiring layer 43 is formed to extend through the second polysilicon layer 40 via the contact hole 45. Consequently, the first aluminum wiring layer 43 is electrically connected to the second polysilicon layer 40 to degrade the function of a circuit. To avoid this, this embodiment employs the insulating layer 46 of an oxide layer or the like interposed therebetween. The insulating layer 46 attains electrical insulation between the aluminum wiring layer 43 and the second polysilicon layer 40.

Figure 3:
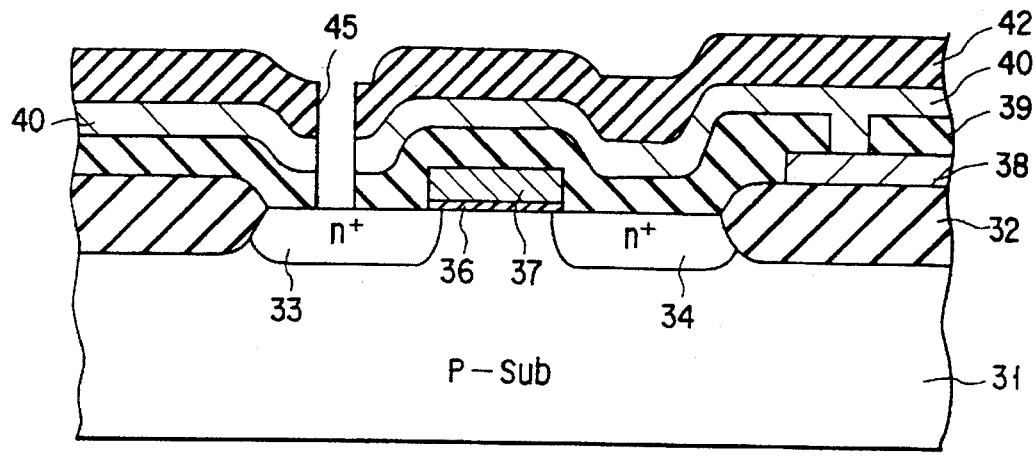

In manufacturing a semiconductor device of this embodiment, the insulating layer 46 is formed according to the following method, for example. As shown in FIG. 3, after the insulating interlayer 39 is formed, according to a normal multilayered polysilicon process, the contact hole 45 is formed for the first aluminum wiring layer 43. The contact hole 45 is formed according to normal photolithography.

In thermal oxidation following the above, the surface, exposed in the contact hole 45, of the second polysilicon layer 40 is oxidized, producing the insulating layer 46, as shown in FIG. 4. A silicon oxide 50 is simultaneously formed on the surface, exposed on the bottom of the contact hole 45, of the silicon substrate 31. Then, the silicon oxide 50 is etched back by anisotropic etching such as RIE to remove the unnecessary silicon oxide 50, as shown in FIG. 5. Although the insulating interlayer 42 is also etched to decrease in thickness, no problem will be expected if a sufficiently thick insulating interlayer 42 is formed to compensate the etched amount.

As shown in FIG. 2, the contact hole 47 for the second aluminum wiring layer 44 is formed on the insulating interlayer 42. The barrier metal layer 48 is then formed on the surface, exposed on the bottom of the contact hole 47, of the second polysilicon layer 40. Thereafter, an aluminum layer is deposited on the insulating interlayer 42 and patterned to form the first and second aluminum wiring layers 43 and 44. Thus, a semiconductor device 30 of this embodiment shown in FIG. 2 can be obtained.

A preferred embodiment wherein the present invention is applied to an SRAM employing a three-layered polysilicon structure will be described below as the second embodiment.

An SRAM is a semiconductor device constituted by a memory cell shown in an equivalent circuit of FIG. 6. As shown in FIG. 6, the memory cell of the SRAM is constituted by a flip-flop circuit including two pull down transistors T1 and T2 and two load resistors R1 and R2, and by two pass transistors T3 and T4. The sources or drains of the pass transistors T3 and T4 are connected to bit lines BL and $\overline{BL}$, respectively. The gate electrodes of the pass transistors T3 and T4 are connected to a word line WL. As shown in FIG. 6, this circuit has two nodes A and B. The node A is a connection portion to which the gate electrode of the pull down transistor T1, the drain of the pull down transistor T2, the load resistor R2, and the source and drain of the pass transistor T4 are connected. The node B is a connection portion to which the gate electrode of the pull down transistor T2, the drain of the pull down transistor T1, the load resistor R1, and the source and drain of the pass transistor T3 are connected. Note that, in the following description, a wiring for connecting the gate electrode of the pull down transistor T1 to the node A is referred to as a cross coupling interconnection A, and a wiring for connecting the gate electrode of the pull down transistor T2 to the node B is referred to as a cross coupling interconnection B.

Various well-known techniques can be applied as a method for monolithically integrating the above memory cell circuit in a semiconductor substrate. Of these well-known techniques, one basis for the present invention will be explained with reference to FIGS. 7 to 10. In this technique, the gate electrodes of the transistors T1 to T4 are formed by the first polysilicon layer, the cross coupling interconnections A and B are by the second polysilicon layer, and the load resistors R1 and R2 are by the third polysilicon layer.

Figure 7:
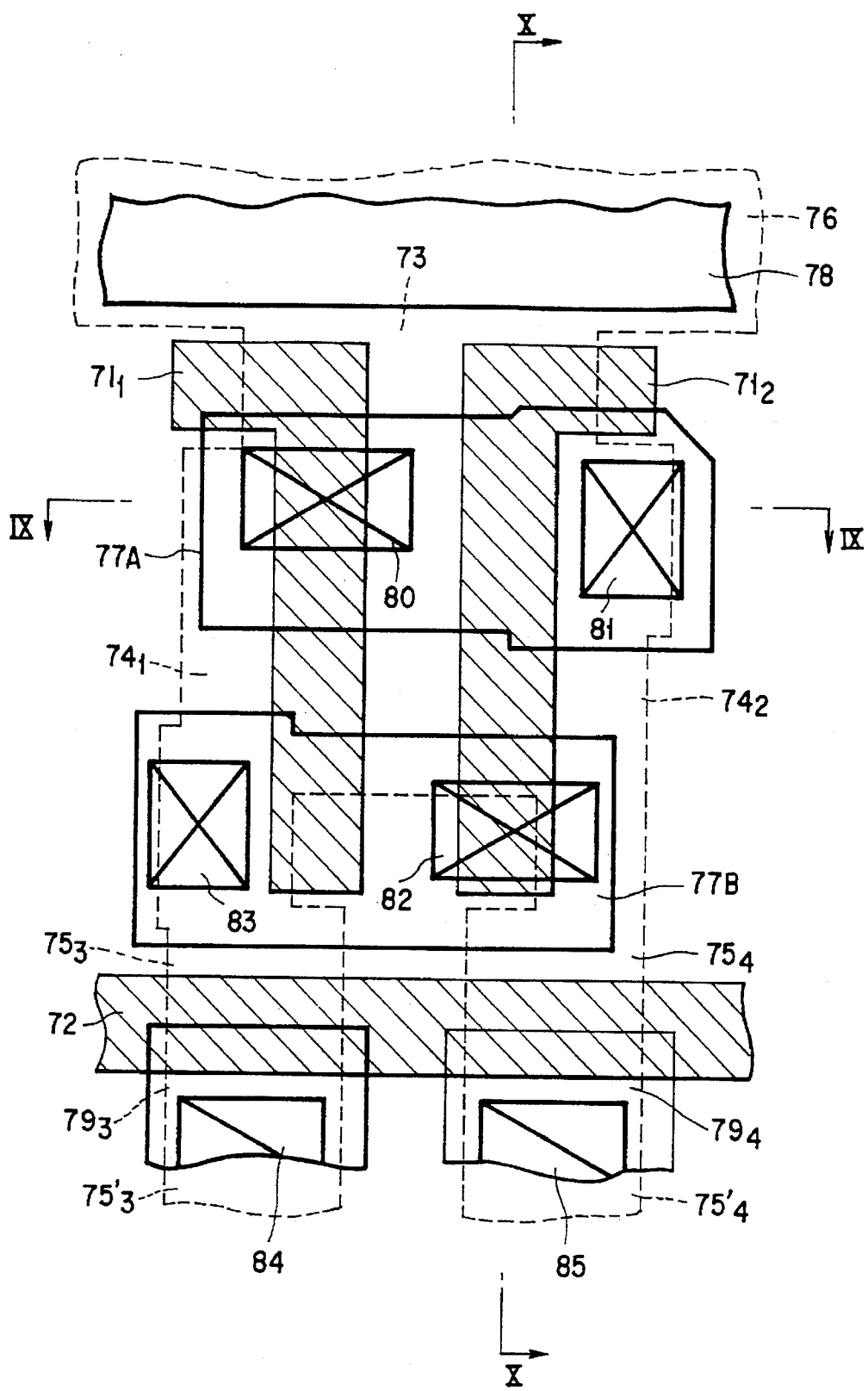
FIG. 7 is a plan view showing patterns of an SRAM memory cell according to the second embodiment of the present invention.
Figure 8:
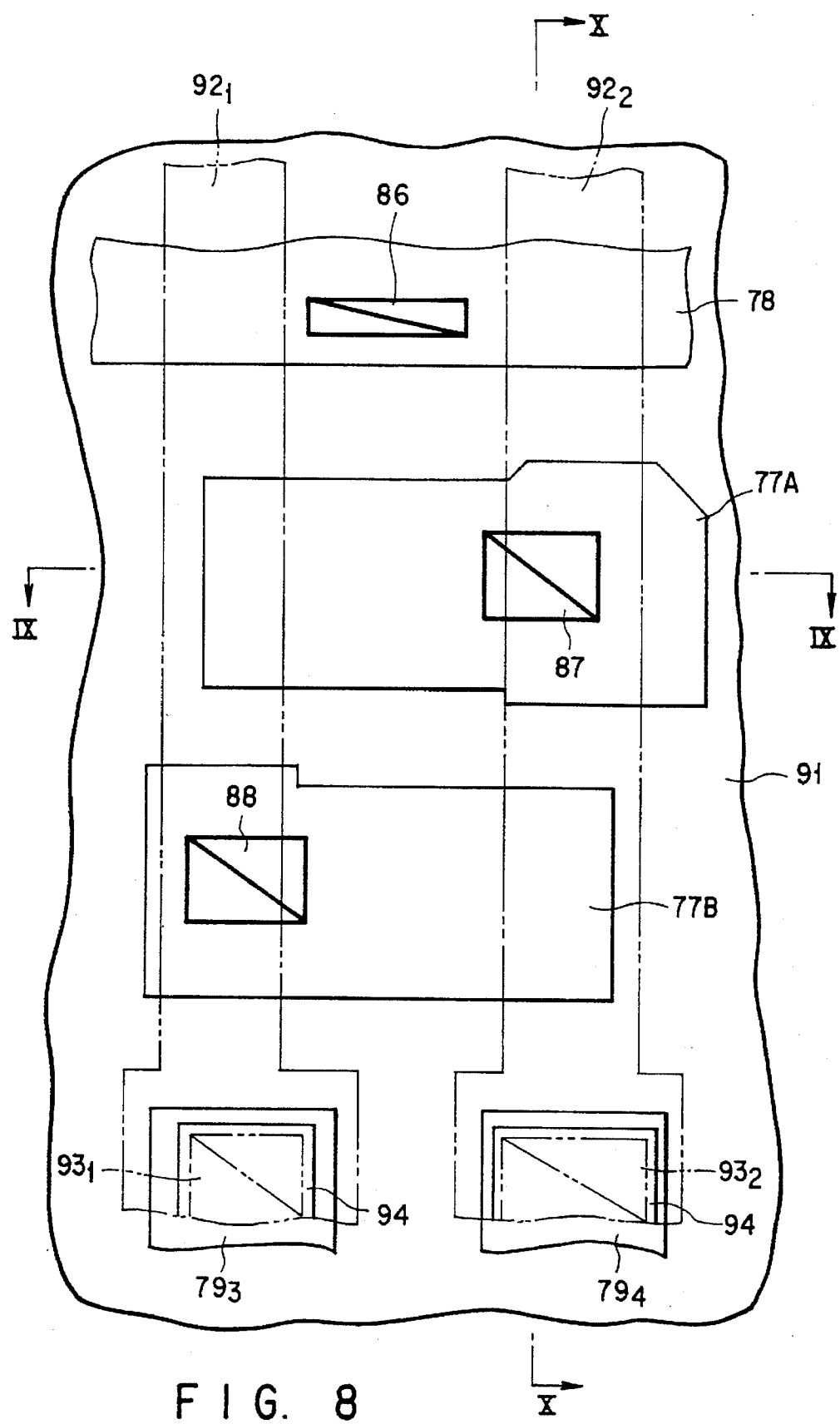
FIG. 8 is a plan view showing patterns of the SRAM memory cell according to the second embodiment of the present invention.

FIG. 7 is a plan view showing patterns up to the second polysilicon layer in the SRAM memory cell according to this embodiment, and FIG. 8 is a plan view showing patterns above the second polysilicon layer. FIG. 9 is a sectional view taken along the lines IX—IX of FIGS. 7 and 8. FIG. 10 is a sectional view taken along the lines X—X of FIGS. 7 and 8.

In FIG. 7, a broken line represents the outer edge of an active region. A field oxide is formed outside the active region. Hatched patterns in FIG. 7 are gate electrodes formed by patterning the first polysilicon layer. That is, reference numeral $71_1$ denotes a gate electrode of the pull down transistor T1; $71_2$, a gate electrode of the pull down transistor T2; and 72, a gate electrode of the pass transistors T3 and T4. The gate electrode 72 of the pass transistors T3 and T4 also serves as the word line WL. In a silicon layer (in this case, a p-well layer) of the active region, $n^+$-type impurity regions (not shown in the figure) are formed except for a portion immediately below the gate electrodes $71_1$, $71_2$, and 72. These $n^+$-type impurity regions constitute a common source regions 73 of the pull down transistors T1 and T2, drain regions $74_1$ and $74_2$ of the pull down transistors T1 and T2, source/drain regions $75_3$, $75'_3$, $75_4$, and $75'_4$ of the pass transistors T3 and T4, and a $V_{ss}$ line 76.

On the other hand, patterns indicated by thick lines In FIG. 7 are wiring layers formed by patterning the second polysilicon layer consisting of polysilicon doped with impurities. That is, reference numeral 77A denotes the cross coupling interconnection A; and 77B, the cross coupling interconnection B. The cross coupling interconnection A is connected to the gate electrode $71_1$ of the pull down transistor T1 via a contact 80 and to the drain region $74_2$ of the pull down transistor T2 via a contact 81. This contact 81 corresponds to the node A shown in the equivalent circuit of FIG. 6.

In contrast, the cross coupling interconnection B is connected to the gate electrode $71_2$ of the pull down transistor T2 via a contact 82 and to the drain region $74_1$ of the pull down transistor T1 via a contact 83. The contact 83 corresponds to the node B shown in the equivalent circuit of FIG. 6. In addition to these cross coupling interconnections A and B, a $V_{cc}$ line 78 is formed immediately above the $V_{ss}$ line 76. Furthermore, contact patterns $79_3$ and $79_4$ consisting of the second polysilicon layer are formed above the source/drain regions $75'_3$ and $75'_4$ of the pass transistors T3 and T4. The contact patterns $79_3$ and $79_4$ are formed to facilitate connection between the pass transistors T3 and T4 and the bit lines formed on the upper side as metal interconnections, i.e., to widen a margin in forming a contact hole. These contact patterns $79_3$ and $79_4$ are connected to the source/drain regions $75'_3$ and $75'_4$ of the transistors T3 and T4 via contacts 84 and 85.

FIG. 8 is a plan view showing the second polysilicon pattern, the third polysilicon layer pattern, and the first metal wiring layer. As indicated by thick lines in FIG. 8, the third polysilicon layer is not patterned at all and is used as a load resistor 91 (R1 and R2). The load resistor 91 is connected to the $V_{cc}$ line 78 via a contact 86 and to the cross coupling interconnection 77A via a contact 87. The contact 87 is formed above the contact 81 and corresponds to the node A shown in FIG. 6.

Moreover, the load resistor 91 is connected to the cross coupling interconnection 77B via a contact 88. The contact 88 is formed above the contact 83 and corresponds to the node B shown in FIG. 6.

Of the load resistor 91, a portion extending from the contact 86 to the contact 88 corresponds to the load resistor R1, and a portion extending from the contact 86 to the contact. 87 corresponds to the load resistor R2. Since the third polysilicon layer is undoped polysilicon and has a high sheet resistance, the load resistors R1 and R2 having giga-ohms to tera-ohms can be realized with this arrangement.

A bit line (BL) $92_1$ and a bit line ($\overline{BL}$) $92_2$ are formed on the third polysilicon layer, as represented by chain double-dashed lines in FIG. 8. The bit lines $92_1$ and $92_2$ consist of a metal wiring layer of, e.g., aluminum. The bit lines $92_1$ and $92_2$ are connected to the contact patterns $79_3$ and $79_4$ formed of the second polysilicon layer via contacts $93_1$ and $93_2$, respectively. This achieves connection between the two bit lines $92_1$ and $92_2$ and the corresponding pass transistors T3 and T4. Oxide layers 94 are formed on the surfaces, exposed in the contacts $93_1$ and $93_2$, of the third polysilicon layer. The oxide layers 94 insulate the bit lines $92_1$ and $92_2$ from the third polysilicon layer.

The sectional views of FIGS. 9 and 10 represent constitutional portions not included in the above explanation. Referring to these drawings, reference numeral 101 denotes a p-type semiconductor layer, i.e., a p-well. A field oxide 102 is formed on the surface of the p-well 101, which defines the active region. A gate oxide 103 is formed on the surface of the active region and interposed between the surface of the active region and the gate electrodes $71_1$, $71_2$, and 72. LDD spacer 104 are formed on the side walls of the gate electrodes $71_1$, $71_2$, and 72. By two-stage doping using these spacer 104, the source/drain regions $74_1$, $74_2$, $75_3$, $75_4$, $75'_3$, and $75'_4$ of the transistors T1, T2, T3, and T4 are formed in a lightly doped drain (LDD) structure. In order to prevent a short circuit between the cross coupling interconnection 77A and the gate electrode $71_2$ at the contact 81 portion corresponding to the node A, a gate protective layer 105 consisting of silicon nitride, for example, is formed on the surface of the gate electrode $71_2$.

An insulating interlayer 106 is formed to insulate the first polysilicon pattern constituting the gate electrodes $71_1$, $71_2$, and 72 from the second polysilicon pattern constituting the cross coupling interconnections 77A and 77B and the $V_{cc}$ lines 78, $79_3$, and $79_4$. An insulating interlayer 107 is formed to insulate the second polysilicon pattern from the third polysilicon layer constituting the load resistor 91. In addition, an insulating interlayer 108 is formed to insulate the third polysilicon layer from the bit lines $92_1$ and $92_2$. The oxide layer 94 is formed to insulate the bit line $92_1$ in the contact $93_1$ from the load resistor 91.

Figure 11:
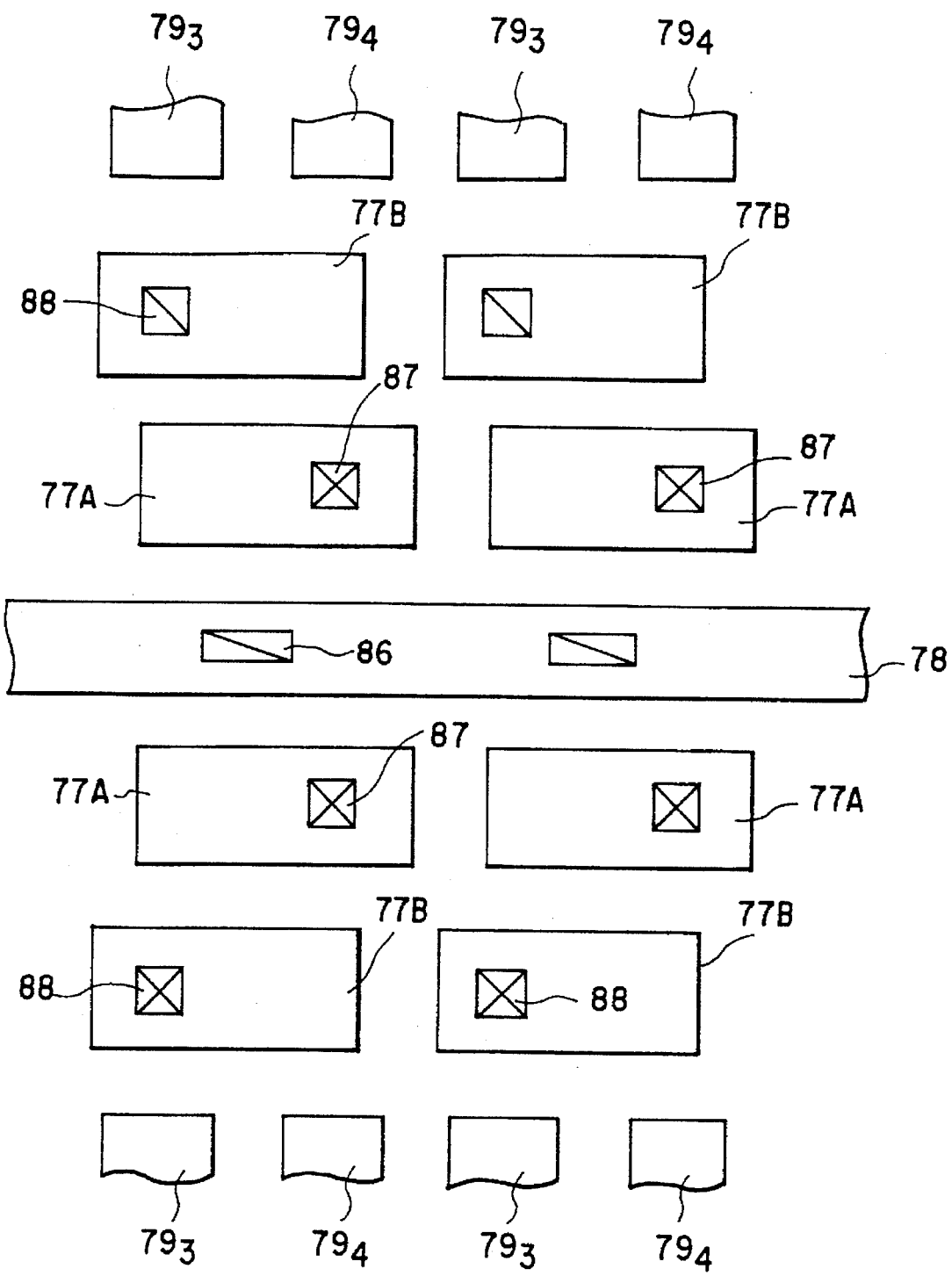
FIG. 11 is a plan view showing the arrangement of SRAM memory cells according to the second embodiment of the present invention.

In an SRAM, a large number of memory cells are formed. The large number of memory cells are arranged in a plane such that they are parallel in the Y-axis direction and mirror-symmetrical in the X-axis direction in FIGS. 7 and 8. FIG. 11 shows the array of four memory cells arranged in a plane. Note that FIG. 11 shows only the second silicon pattern (the cross coupling interconnections 77A and 77B, the $V_{cc}$ lines 78, and the contact patterns $79_3$ and $79_4$). The load resistor 91 is not patterned as described above and is continuously formed on the entire surface. The planar pattern shown in FIG. 11 is repeated to be parallel in the Y-axis direction and mirror-symmetrical in the X-axis direction, obtaining the whole arrangement of the SRAM memory cells.

As is apparent from FIGS. 9 and 10, first, the SRAM of the present embodiment uses the load resistor 91 consisting of the undoped polysilicon layer not subjected to any patterning. This greatly relaxes a stepped portion on the surface, and poor step coverage of the bit lines $92_1$ and $92_2$ formed on the load resistor 91, and a short circuit or bridging can be avoided. Further, the load resistor 91 has a sufficient resistance.

More specifically, according to the same procedure described in the first embodiment, the resistance of the load resistor 91 in the SRAM of the second embodiment was divided into the following three components to measure a contribution ratio of the resistance components. As a result, it was proved that the undoped polysilicon pattern 91 itself did not much contribute.

(a) Resistance component (to be referred to as R(a) hereinafter) of the high resistor 91 itself (b) Resistance component (to be referred to as R(b) hereinafter) of the contact 86 to the $V_{cc}$ polysilicon pattern 78

(c) Resistance component (to be referred to as R(c) hereinafter) of the contacts 87 and 88 to the cross coupling polysilicon wiring layers 77A and 77B First, R(a)+R(b)+R(c) was measured using normal TEG. On the other hand, the resistance component R(a) of the undoped third polysilicon layer 91 was measured without forming the contacts 86 to 88. When R(a)/R(a)+R(b)+R(c) was calculated on the basis of the obtained measurement result, it was found that R(a) was 0 to 20% at most.

This means that the two contact resistance components R(b) and R(c) satisfy almost the resistance of the high resistor 91, as indicated by the following relation.

$$R(b)+R(c)/R(a)+R(b)+R(c)=80 \text{ to } 100\%$$

Therefore, it was found that an undoped polysilicon layer indicated a sufficiently high resistance as a load resistor even if the undoped polysilicon layer was, unlike the conventional one, not patterned to a normal linear shape. The percentage of the resistance component of the third polysilicon layer itself is much lower than that in the first embodiment because the two contact resistance components R(b) and R(c) are caused by the contacts between the two polysilicon layers.

Second, since the load resistor 91 need not be patterned, no special mask is naturally required. High-accuracy mask alignment is not required in highly precisely connecting the load resistor 91 to the cross coupling interconnections 77A and 77B via the contact holes 87 and 88. Consequently, the manufacturing process is greatly facilitated.

In the second embodiment, on the other hand, insulation between the load resistor 91 not subjected to patterning and the bit lines $92_1$ and $92_2$ is attained by interposing the oxide layers 94 therebetween.

Such an insulated structure is formed as shown in FIGS. 12 to 16. Note that these drawings show sectional views corresponding to FIG. 10. However, the illustrated range is different from that of FIG. 10, and they show a range from the left end portion in FIG. 10 to an adjacent memory cell. For the descriptive convenience, FIGS. 12 to 16 show only the wiring structure, and the silicon substrate 101 and the field oxide 102 are not illustrated.

Figure 12:
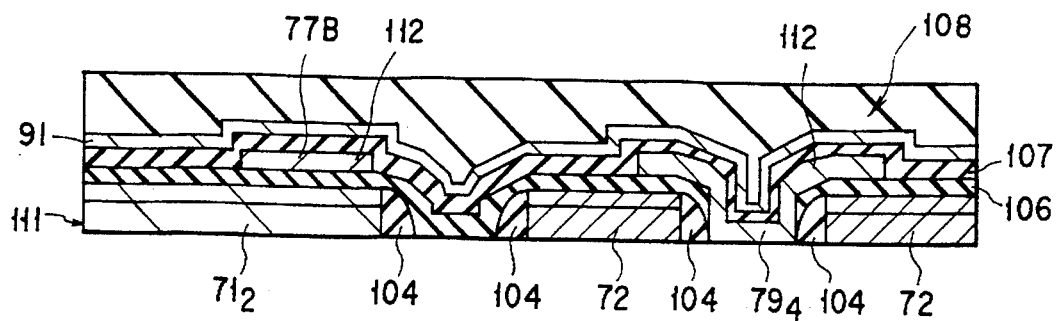
FIGS. 12 to 16 are sectional views showing each steps of manufacturing the SRAM memory cell according to the second embodiment of the present invention.

First of all, a structure shown in FIG. 12 is obtained according to a normal three-layered polysilicon process method. That is, an impurity-doped first polysilicon layer 111 is patterned to form the gate electrodes $71_2$ and 72 and then the LDD spacer 104. After the insulating interlayer 106 is deposited, and necessary contact holes (not shown in the figure) are formed, polysilicon is deposited. The polysilicon is doped with impurities, such as As. Titanium is deposited on this polysilicon, and the obtained structure is heated to cause a reaction, thereby silicifying polysilicon. With this operation, a second polysilicon layer 112 having a low resistance is formed. Further, the second polysilicon layer 112 is patterned to form the second polysilicon pattern for the cross coupling interconnection 77B, the contact pattern $79_4$, and the like.

Next, the insulating interlayer 107 is deposited to form necessary contact holes (not shown in the figure). On the insulating interlayer 107, polysilicon is deposited to form the undoped third polysilicon layer. This undoped third polysilicon layer is used as the load resistor 91 without performing any patterning. On the load resistor 91, a BPSG layer is deposited to form the insulating interlayer 108.

Figure 13:
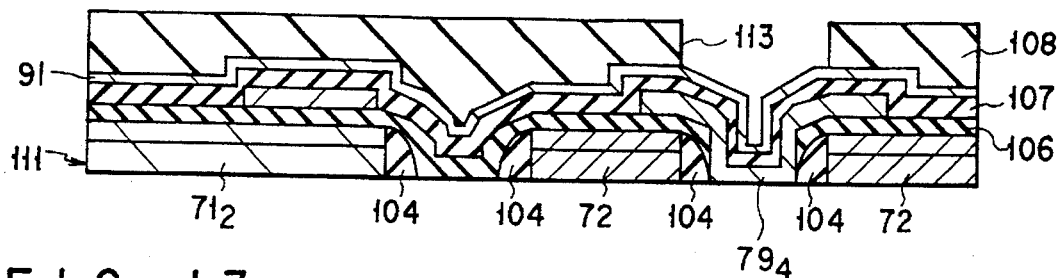

As shown in FIG. 13, a contact hole 113 is formed above the contact pattern $79_4$. As shown in FIG. 13, etching for forming the contact hole 113 is stopped when the load resistor 91 is exposed.

Figure 14:
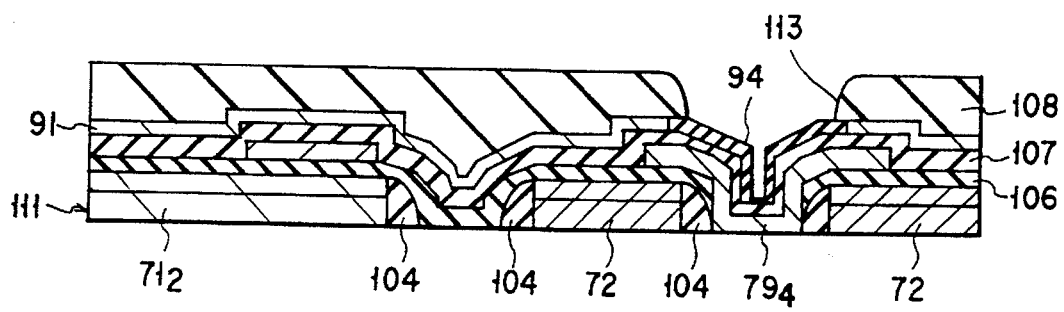

Annealing is performed on an object to be processed in a state of FIG. 13 to planarize the insulating interlayer 108. In this annealing, an oxygen gas ($O_2$) is used instead of normally used $N_2$ gas substitution. Since the insulating interlayer 108 consisting of the BPSG layer is melted in this annealing, the edge portion of the BPSG layer in the contact hole 113 is rounded, as shown in FIG. 14. At the same time, a portion, exposed in the contact hole 113, of the load resistor 91 is oxidized with the $O_2$ gas to form the oxide layers 94. This oxidization progresses inward from the side wall of the oxide layers 94.

Figure 15:
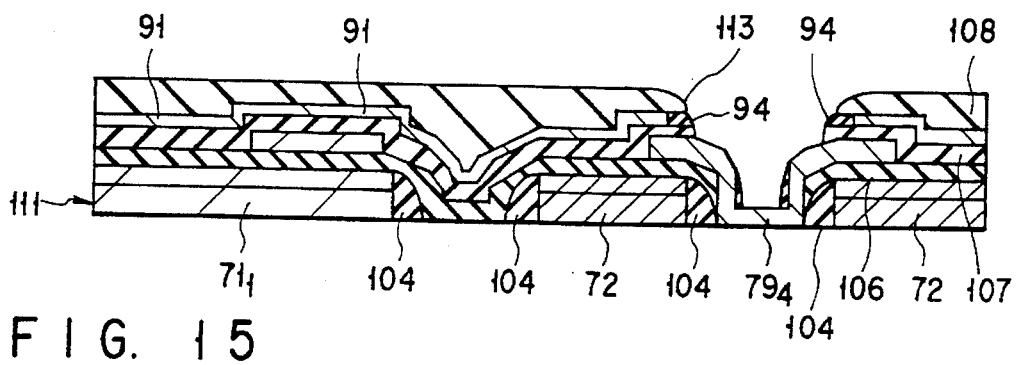

Then, anisotropic reactive ion etching (RIE) is performed to etch back the whole structure until the oxide layers 94 and the insulating interlayer 107 are removed. As shown in FIG. 15, the contact pattern $79_4$ is exposed.

Figure 16:
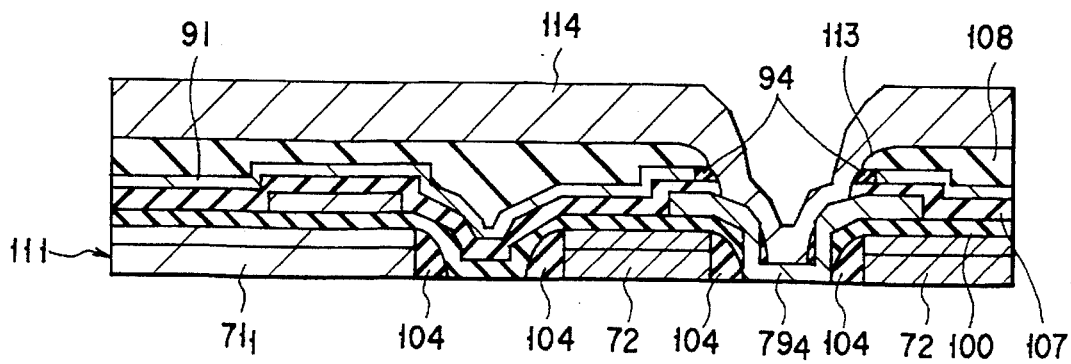

Aluminum deposition and patterning are performed according to normal methods to form the bit line 114, as shown in FIG. 16. This bit line 114 realizes connection to the contact pattern $79_4$, and the oxide layers 94 insulates the load resistor 91 from the bit line 114.

Note that, the film thickness of the insulating interlayer 108 is decreased by etching back in the state of FIG. 15. For this reason, when a desired thickness of the insulating interlayer 108 is relatively small, a short circuit may occur between the bit line 114 and the load resistor 91. To prevent this short circuit, the insulating interlayer 108 is deposited to a larger thickness than a desired thickness. Alternatively, an oxide layer may be deposited on the entire surface of the insulating interlayer 108 before etching back to increase the thickness of the insulating interlayer 108.

In the second embodiment as described above, the second polysilicon layer is decreased in resistance by doping with impurities. However, it can be replaced to other low resistance layer containing silicon. The low resistance layer, for example, can be made of amorphous silicon which is doped with impurities, or metal silicides such as tungsten silicide.

Also, the material for third polysilicon layer may be replaced to other high resistance silicon such as undoped amorphous silicon.

The third embodiment of the present invention will be described with reference to FIGS. 17 to 19.

Figure 17:
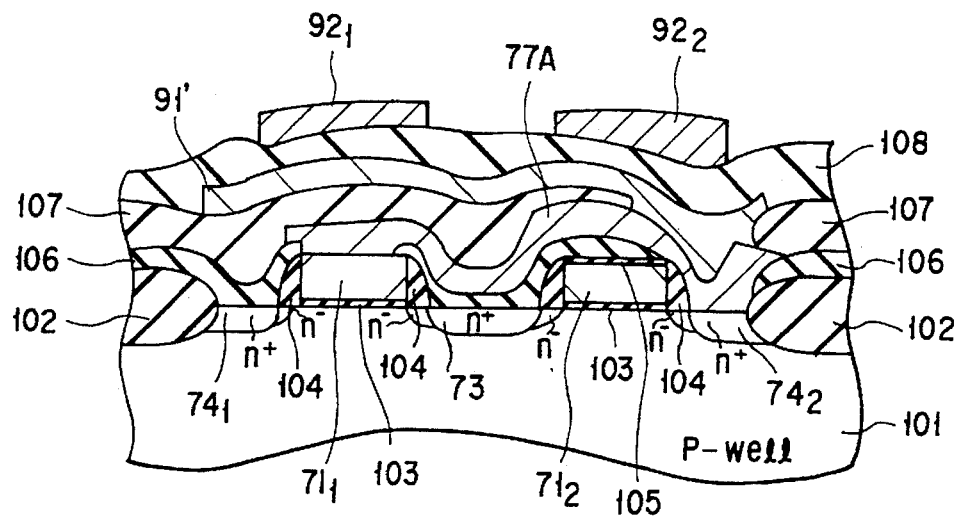
FIG. 17 is a sectional view showing an SRAM memory cell according to the third embodiment of the present invention.
Figure 18:
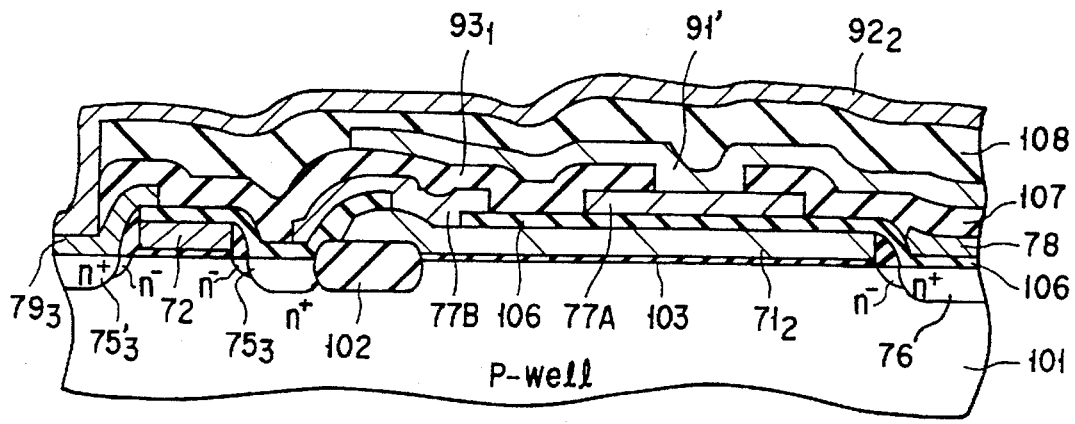
FIG. 18 is a sectional view showing the SRAM memory cell according to the third embodiment of the present invention.
Figure 19:
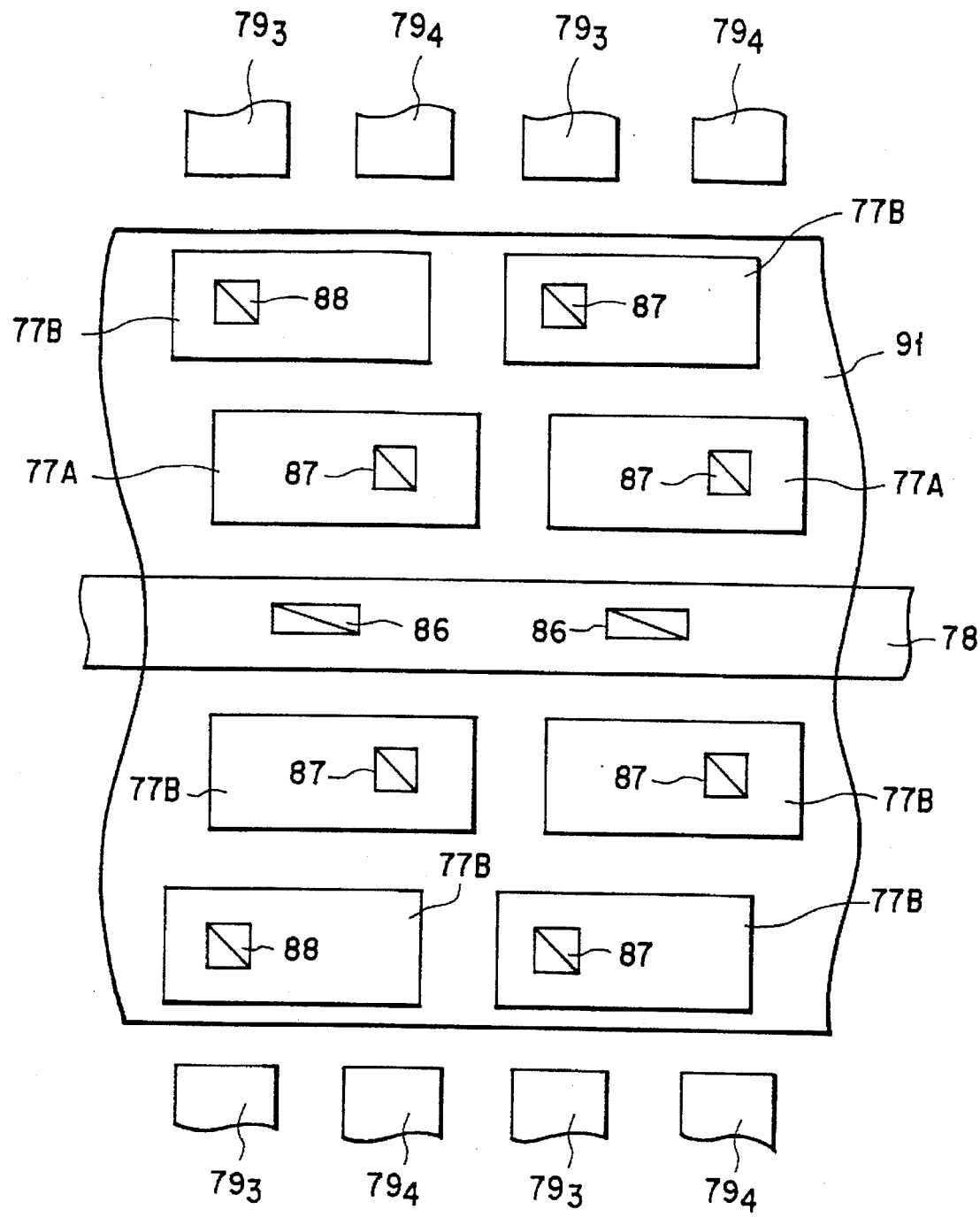
FIG. 19 is a plan view showing a pattern of the SRAM memory cell according to the third embodiment of the present invention.

FIGS. 17 to 19 show an SRAM memory obtained by applying the third embodiment of the present second invention to the SRAM memory cell of the second embodiment shown in FIGS. 7 to 11. FIGS. 17 and 18 are sectional views corresponding to FIGS. 9 and 10, respectively. FIG. 19 is a plan view corresponding to FIG. 11. The same reference numerals as in the second embodiment denote the same parts in this embodiment, and a detailed description thereof will be omitted.

As is apparent from FIGS. 17 to 19, according to the third embodiment, a load resistor 91' is formed by patterning the third polysilicon layer. But the shape of the load resistor 91' is different from that of the conventional one. That is, in the SRAM of the third embodiment, the load resistor 91' is formed not by a linear pattern like a normal high resistor device but by a planar pattern so as to cover the entire core area where a flip-flop circuit is formed. As is clearly shown in the plan view of FIG. 19, the load resistor 91' is formed by a continuous pattern so as to cover the core areas of one memory cell and adjacent memory cells.

First, in the SRAM memory cell of the third embodiment, the load resistor 91' is formed by the pattern which covers the entire core area. This arrangement greatly relaxes a stepped portion on the surface of the core area, and poor step coverage of first and second aluminum wiring layers $92_1$ and $92_2$ formed thereon, and a short circuit or bridging can be avoided.

Second, since the load resistor 91' has a large planar pattern, a patterning margin is large, and etching is not required to be controlled at high accuracy. With the large pattern, the load resistor 91' can be properly connected to cross coupling interconnections 77A and 77B via contact holes 87 and 88 even if mask alignment is shifted somewhat. Therefore, in patterning a polysilicon layer for forming the load resistor 91', high-accuracy mask alignment is not required. Consequently, the manufacturing process is greatly facilitated.

Third, patterning of the polysilicon layer for forming the load resistor 91' does not require any special photomask, which is an advantage worthy to be pointed out. That is, as will be described below, the load resistor 91' can be patterned with a photomask used in another process.

FIG. 20 shows a state wherein a resist pattern 202 is formed which serves as an etching mask in patterning an undoped third polysilicon layer 201 in order to form the load resistor 91' of the above embodiment. As shown in FIG. 20, the resist pattern 202 covers only the core area and has an opening at a portion corresponding to an area except for the core area. To the contrary, FIG. 21 shows a state wherein an impurity is ion-implanted in the core area to adjust the threshold values of pull down transistors T1 and T2. In this channel ion implantation, a resist pattern 203 used as a blocking mask has an opening on the core area. As is apparent from comparison between the two resist patterns 202 and 203, their shapes are complementary to each other. This fact indicates that the two resist patterns 202 and 203 can be formed with one common photomask.

For example, if a negative resist is used for forming the resist pattern 203 in FIG. 21, the resist pattern 202 in FIG. 20 can be formed with the same photomask as in FIG. 21 which is only changed to a positive type. Similarly, if a positive resist is used for forming the resist pattern 203 in FIG. 20, the resist pattern 202 in FIG. 20 can be formed with the same photomask as in FIG. 21 which is only changed to a negative type. In this manner, patterning of the load resistor 91' does not require any special photomask, which is a great advantage because a reticle and a photomask require a high manufacturing cost.

What is claimed is:

1. A semiconductor device comprising:

a semiconductor substrate having an impurity diffusion region formed on a major surface;

a low resistance silicon-containing layer provided on said major surface of said semiconductor substrate via an insulating layer and formed with a desired pattern, said low resistance silicon-containing layer functioning as one of an electrode and an interconnection;

a high resistance silicon layer formed on said major surface of said semiconductor substrate including said low resistance silicon-containing layer via an insulating layer, said high resistance silicon layer being not patterned, being connected to said low resistance silicon layer via a contact hole which is formed to extend through said insulating layer, and functioning as a resistor having a high resistance; and a metal wiring layer provided on a surface of said high resistance silicon layer via an insulating layer and formed with a desired pattern, said metal wiring layer being connected to one of said low resistance silicon-containing layer and said impurity diffusion region via a contact hole which is formed to extend through at least said insulating layer and said high resistance silicon layer.

2. A device according to claim 1, wherein said low resistance silicon-containing layer consists one of doped polysilicon and doped amorphous silicon.

3. A device according to claim 1, wherein said high resistance silicon layer consists one of undoped polysilicon and undoped amorphous silicon.

4. A device according to claim 1, wherein said high resistance silicon layer is formed to cover an entire area of said semiconductor substrate.

5. A device according to claim 1, further comprising an SRAM memory cell formed in an active region wherein a gate electrode of a MOS transistor constituting said SRAM memory cell and a cross coupling interconnection constituting a flip-flop circuit are formed by said low resistance silicon-containing layer;

a load resistor of said SRAM memory cell is formed by said high resistance silicon layer;

a bit line of said SRAM memory cell is formed by said metal wiring layer; and said metal wiring layer is connected to source and drain regions of a pass transistor constituting said SRAM memory cell.

6. A device according to claim 5, further comprising:

a three-layered structure of silicon having first and second silicon layers consisting of said low resistance silicon-containing layer, and said high resistance silicon layer, wherein said gate electrode is formed by said first silicon layer;

said cross coupling interconnection is formed by said second silicon layer; and said load resistor is formed by a third silicon layer.

7. A device according to claim 1, wherein said high resistance silicon layer is insulated from said metal wiring layer at the contact hole which is formed to extend through at least said insulating layer and said high resistance silicon layer.

8. A device according to claim 1, wherein said insulating layer is an oxide film obtained by oxidizing said high resistance silicon layer exposed in the contact hole.

9. A semiconductor device comprising an SRAM memory cell formed in an active region wherein a core area including two pull down MOS transistors, a cross coupling interconnection, a load resistor, and a $V_{cc}$ line, which constitute a flip-flop circuit of said SRAM memory cell, is formed in a predetermined core area of said active region;

two pass MOS transistors of said SRAM memory cell are formed in said active region outside said core area; and said load resistor consists of high resistance silicon layer which is different from a layer of gate electrodes of said MOS transistors, said cross coupling interconnection, and said $V_{cc}$ line, and is patterned to a planar shape to entirely cover said core area.

10. A device according to claim 9, wherein said high resistance silicon layer consists one of undoped polysilicon and undoped amorphous silicon.

11. A device according to claim 9, wherein said gate electrodes of said MOS transistors, said cross coupling interconnection, and said $V_{cc}$ line consist of a low resistance silicon-containing layer.

12. A device according to claim 9, wherein said low resistance silicon containing layer consists one of doped polysilicon and doped amorphous silicon.

13. A device according to claim 9, wherein gate electrodes of said pull down MOS transistors and gate electrodes of said pass MOS transistors are formed by a first silicon layer;

said cross coupling interconnection and said $V_{cc}$ line are formed by a second silicon layer;

said load resistor is formed by a third silicon layer; and said load resistor is connected to said $V_{cc}$ line and said cross coupling interconnection.

14. A device according to claim 13, wherein said first silicon layer and said second silicon layer consist of a low resistance silicon-containing layer, and said third silicon layer consists of a high resistance silicon layer.

* * * * *